(12) United States Patent
Nikuie et al.

(10) Patent No.: US 12,197,320 B2
(45) Date of Patent: Jan. 14, 2025

(54) SYSTEM AND METHOD FOR ENHANCING FLASH CHANNEL UTILIZATION

(71) Applicant: Microchip Technology Incorporated, Chandler, AZ (US)

(72) Inventors: Nima Nikuie, San Francisco, CA (US); Ihab Jaser, San Jose, CA (US); Jack Wynne, Los Altos, CA (US)

(73) Assignee: Microchip Technology Incorporated, Chandler, AZ (US)

( * ) Notice: Subject to any disclaimer, the term of this patent is extended or adjusted under 35 U.S.C. 154(b) by 98 days.

(21) Appl. No.: 17/981,780

(22) Filed: Nov. 7, 2022

(65) Prior Publication Data

US 2023/0141986 A1    May 11, 2023

Related U.S. Application Data

(60) Provisional application No. 63/276,742, filed on Nov. 8, 2021.

(51) Int. Cl.
*G06F 12/00* (2006.01)
*G06F 12/02* (2006.01)
*G06F 12/126* (2016.01)

(52) U.S. Cl.
CPC ........ *G06F 12/0246* (2013.01); *G06F 12/126* (2013.01); *G06F 2212/72* (2013.01)

(58) Field of Classification Search
CPC .............. G06F 12/0246; G06F 12/126; G06F 2212/72; G06F 3/061; G06F 3/0619; G06F 3/0659; G06F 3/0679; G11C 16/10
USPC ........................................................ 711/103
See application file for complete search history.

(56) References Cited

U.S. PATENT DOCUMENTS

| | | | | |
|---|---|---|---|---|
| 2004/0151026 A1* | 8/2004 | Naso | ........................ | G11C 7/24 365/185.04 |
| 2014/0337855 A1* | 11/2014 | Bass | ..................... | G06F 9/5044 718/107 |
| 2018/0217951 A1* | 8/2018 | Benisty | ............... | G06F 13/1642 |

OTHER PUBLICATIONS

International Search Report and Written Opinion, Application No. PCT/US2022/049197, 12 pages, Feb. 28, 2023.

* cited by examiner

*Primary Examiner* — Mardochee Chery
(74) *Attorney, Agent, or Firm* — SLAYDEN GRUBERT BEARD PLLC

(57) ABSTRACT

An apparatus and method for dispatching flash commands. The apparatus includes a plurality of queues, wherein each queue comprises an input to receive a flash command, an output to send a flash command, and an empty signal output to signal when the queue is empty, wherein each queue is assigned a unique, ordered priority. The apparatus includes a selector comprising a plurality of flash command inputs, a flash command output to a flash target, and a selection input, wherein each flash command input is coupled to a corresponding queue output. The apparatus includes an arbiter comprising inputs receiving each queue empty signal and receiving a lock bit from the flash command output of the selector and comprising a selection output coupled to the selection input of the selector. The flash command comprises a lock bit and a plurality of control bits to output to control inputs on a flash target.

20 Claims, 3 Drawing Sheets

SYSTEM AND METHOD FOR ENHANCING FLASH CHANNEL UTILIZATION

RELATED PATENT APPLICATION

This application claims priority to commonly owned U.S. Provisional Patent Application No. 63/276,742, which is hereby incorporated by reference.

FIELD OF THE INVENTION

The present application relates to systems and methods for dispatching requests to flash memories.

BACKGROUND

Flash storage devices offer high throughput, low latency long term storage of computer data. Some types of requests are faster than others. For example, some control operations complete nearly instantaneously. For example, a control request may increase or decrease the operating voltage of a flash target by updating a control register and may complete in nanoseconds. A read request may require setup of control lines and reads from NAND cells into a local buffer. A flash read may take on the order of several microseconds to complete. A write request may require setup of control lines and programming operations in the NAND cells. A flash write may take on the order of milliseconds to complete.

SUMMARY

In some examples, an apparatus is provided including a plurality of queues, wherein each queue comprises an input to receive a flash command, an output to send a flash command, and an empty signal output to signal when the queue is empty, wherein each queue is assigned a unique, ordered priority. The apparatus includes a selector comprising a plurality of flash command inputs, a flash command output to a flash target, and a selection input, wherein each flash command input is coupled to a corresponding queue output. And the apparatus includes an arbiter comprising inputs receiving each queue empty signal and receiving a lock bit from the flash command output of the selector and comprising a selection output coupled to the selection input of the selector. In the apparatus, the flash command comprises a lock bit and a plurality of control bits to output to control inputs on a flash target. In certain examples, while the lock bit of the flash command output is asserted, the arbiter maintains the value of the selection output. In certain examples, while the lock bit of the flash command output is asserted, the arbiter maintains the value of the selection output. In certain examples, the arbiter comprises logic to identify a set of non-empty queues and set the selection output to the highest priority one of the non-empty queues. In certain examples, the plurality of queues comprises a low priority queue, a high priority queue, and an ultra priority queue, and the arbiter sets the value of the selection output to the ultra priority queue unless it is empty, otherwise the arbiter sets the value of the selection output to the high priority queue unless it is empty, otherwise the arbiter sets the value of the selection output to the low priority queue. In certain examples, the arbiter receives a transfer begin signal and a transfer end signal and the arbiter maintains a current value at the selection output when the lock bit is asserted, otherwise the arbiter sets the value of the selection output to the ultra priority queue unless it is empty, otherwise the arbiter maintains a current value at the selection output between an assertion of the transfer begin signal and the assertion of the transfer end signal, otherwise the arbiter sets the value of the selection output to the high priority queue unless it is empty, otherwise the arbiter sets the value of the selection output to the low priority queue. In certain examples, the arbiter receives a transfer begin signal, a transfer end signal, and a write transfer signal, and the arbiter maintains a current value at the selection output when the lock bit is asserted, otherwise the arbiter sets the value of the selection output to the ultra priority queue unless it is empty, otherwise the arbiter maintains the current value at the selection output between an assertion of the transfer begin signal and the assertion of the transfer end signal when the write transfer signal is asserted, otherwise the arbiter sets the value of the selection output to the high priority queue unless it is empty, otherwise the arbiter sets the value of the selection output to the low priority queue. In certain examples, the plurality of queues is stored in a single memory.

In some examples, a method is performed in a system comprising a plurality of queues wherein each queue is assigned a unique, ordered priority. The method including storing a new flash command having a lock flag and associated with a first priority in a one of the plurality of queues corresponding to the first priority, selecting a current queue from which to dispatch a flash command, and dispatching an oldest flash command from the current queue to a flash memory target. In certain examples, the lock flag is asserted, maintaining the current queue selection. In certain examples, selecting the current queue comprises selecting the highest priority non-empty queue. In certain examples, selecting the current queue is performed by an arbiter to select the ultra priority queue unless it is empty, otherwise select the high priority queue unless it is empty, otherwise select the low priority queue. In certain examples, selecting the current queue is performed by an arbiter to maintain a current selection when the lock flag is asserted, otherwise select the ultra priority queue unless it is empty, otherwise maintain the current selection between an assertion of a transfer begin signal and the assertion of a transfer end signal, otherwise select the high priority queue unless it is empty, otherwise select the low priority queue. In certain examples, selecting the current queue is performed by an arbiter to maintain a current selection when the lock flag is asserted, otherwise select the ultra priority queue unless it is empty, otherwise maintain the current selection between an assertion of the transfer begin signal and the assertion of the transfer end signal when the write transfer signal is asserted, otherwise select the high priority queue unless it is empty, otherwise select the low priority queue. In certain examples, the plurality of queues is maintained as a data structure in a single memory.

In some examples, a non-transitory, computer readable memory is provided including RTL structures and logic that when simulated forms a machine including a plurality of queues, wherein each queue comprises an input to receive a flash command, an output to send a flash command, and an empty signal output to signal when the queue is empty, wherein each queue is assigned a unique, ordered priority. The machine including a selector comprising a plurality of flash command inputs, a flash command output to a flash target, and a selection input, wherein each flash command input is coupled to a corresponding queue output. The machine including an arbiter comprising inputs receiving each queue empty signal and receiving a lock bit from the flash command output of the selector and comprising a selection output coupled to the selection input of the selector. In certain examples, the received lock bit is asserted, the arbiter maintains the value of the selection output. In certain examples, the arbiter comprises logic to identify a set of non-empty queues and set the selection output to the highest priority non-empty queue. In certain examples, the plurality of queues comprises a low priority queue, a high priority queue, and an ultra priority queue, and the arbiter sets the value of the selection output to the ultra priority queue unless it is empty, otherwise the arbiter sets the value of the selection output to the high priority queue unless it is empty, otherwise the arbiter sets the value of the selection output to the low priority queue. In certain examples, the arbiter receives a transfer begin signal and a transfer end signal and the arbiter maintains a current selection output when the lock bit is asserted, otherwise the arbiter sets the value of the selection output to the ultra priority queue unless it is empty, otherwise the arbiter maintains the current selection output between an assertion of the transfer begin signal and the assertion of the transfer end signal, otherwise the arbiter sets the value of the selection output to the high priority queue unless it is empty, otherwise the arbiter sets the value of the selection output to the low priority queue. In certain examples, the arbiter receives a transfer begin signal, a transfer end signal, and a write transfer signal, and the arbiter maintains a current value at the selection output when the lock bit is asserted, otherwise the arbiter sets the value of the selection output to the ultra priority queue unless it is empty, otherwise the arbiter maintains the current selection output between an assertion of the transfer begin signal and the assertion of the transfer end signal when the write transfer signal is asserted, otherwise the arbiter sets the value of the selection output to the high priority queue unless it is empty, otherwise the arbiter sets the value of the selection output to the low priority queue.

DETAILED DESCRIPTION

Figure 1:
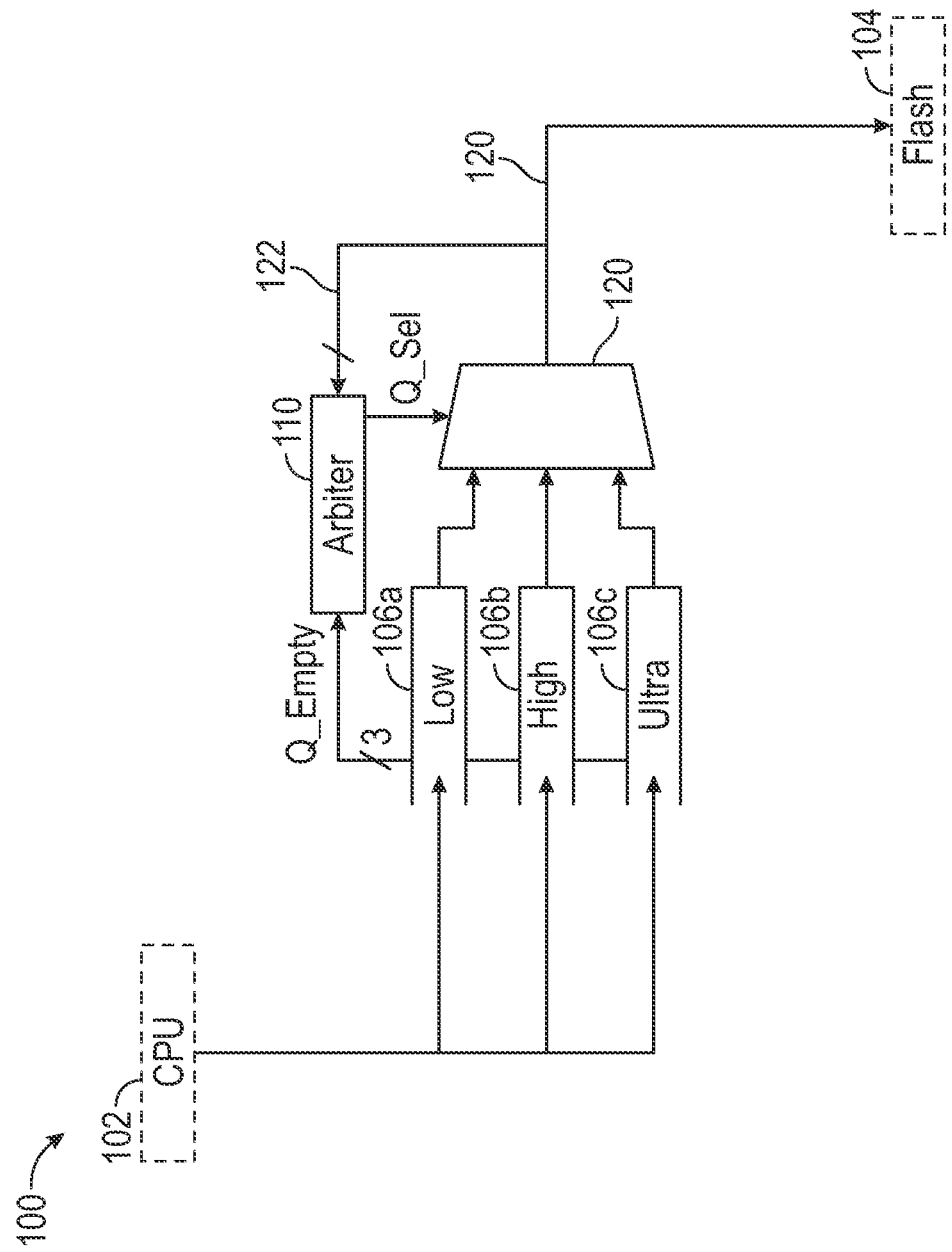
FIG. 1 is an illustration of a system for dispatching requests to a flash memory, according to examples of the present disclosure.

FIG. 1 is an illustration of a system for dispatching requests to a flash memory, according to examples of the present disclosure. Requests may be queued based on priority and dispatched according to an arbitration scheme. The arbitration scheme may allow various types of overrides to accommodate bursts, especially high priority requests, and transactions spanning multiple requests. The arbitration scheme may allow for execution of ultra high priority control commands to instruct a first flash target to begin adjusting voltages for a read. These control commands may be quick to dispatch but may require a significant delay before issuing a read command. The arbitration scheme may follow those control commands with a low priority burst of write commands to a different flash target previously configured to write. The arbitration scheme may dispatch the entire sequence of write commands atomically to maintain data consistency. The arbitration scheme's "pipelining" of operations may improve flash memory performance. System 100 couples to flash controller CPU 102 and flash memory target 104. System 100 may be incorporated within a flash memory controller integrated circuit. System 100 comprises queues 106a-106c coupled to and receiving flash memory commands from CPU 102. Each queue may be a first in first out queue storing zero or more flash command records. Queues 106a-106c are associated with priority levels. As illustrated, queue 106a is associated with a low priority level, queue 106b is associated with a high priority level, and queue 106c is associated with an ultra-high priority level. In some examples, write requests are assigned to low priority queue 106a, read requests are assigned to high priority queue 106b, and control requests are assigned to ultra-high priority queue 106c. Queues 106a-106c have read ports coupled to inputs of parallel mux 108. Mux 108 has an output coupled to flash target 104 or a set of addressable flash targets 104. Arbiter 110 is coupled to empty output signals of queues 106a-106c enabling it to determine when each queue is empty. Arbiter 110 is also coupled to some output lines of mux 108. In some examples, arbiter 110 receives signals 122 passing the value of arbitration flags from a dispatched flash command record. Signals 133 may include flag signifying transfer begin, transfer end, write transfer, read transfer, and lock. Each flag may be set by CPU 102 and stored within or in conjunction with each flash command record in queues 106a-106c. Arbiter 110 drives the queue select input on mux 108 to select the queue from which the next request will be passed to flash target 104 via command lines 120.

In one mode of operation, arbiter 110 is configured to arbitrate between queues 106a-106c on a strict priority basis. At each arbitration decision arbiter 110 will select the highest priority queue that contains requests. For example, if all three queues contain requests, arbiter 110 will select from ultra priority queue 106c until that queue is empty and will then draw from high priority queue 106b until that queue is empty and will then draw from low priority queue 106a. If arbiter 110 is drawing from low priority queue 106a and a new request arrives an ultra priority queue 106c, arbiter 110 will draw from ultra priority queue 106c at the next arbitration decision.

In some examples, CPU 102 may have set the lock bit on a series of requests in a particular queue to force the arbiter to draw from that queue until the lock signal has been cleared. In some examples, arbiter 110 may exit its locked mode when that queue is empty.

In some examples, a series of requests may be logically related. For example, a burst read operation may read 32 KB of data sequentially from a flash target. The flash target may be organized internally as 16 KB pages with a transfer size of 4 KB in a single chunk. In this example, CPU 102 may issue a series of ten requests to complete the overall operation. CPU 102 may issue a read command for the first page followed by four sequential read transfer commands. The first read transfer command of the four may include a xfer_begin flag and a rd_xfer flag and the last of the four may include a xfer_end flag and a rd_xfer flag. CPU 102 may then issue a second page read command and four read transfer commands to complete the overall transfer.

In another example, CPU 102 may issue a series of five requests to complete a write transaction of 16 KB to flash target 104, e.g., four write transfer requests followed by a write request. Because write requests are low priority, a read request arriving before all five requests in the write sequence can interrupt may be scheduled by arbiter 110 immediately, thus interrupting the larger write transaction. In some examples, arbiter 110 may mark all five requests as incomplete and return them to the queue. In some examples, arbiter 110 may signal CPU 102 that the write transaction was preempted. CPU 102 may requeue or cancel the preempted write transaction.

In some examples, CPU 102 may mark a sequence of commands indicating they are part of a burst transfer. CPU 102 may mark the first command in a sequence as Rd_xfer, signaling the start of a burst read. CPU 102 may mark the second command Xfer_begin signaling the start of a series of burst transfers and the last command in the sequence Xfer_end signaling the end of a read sequence. In some examples, arbiter 110 may continue to schedule from high priority queue 106*b* until arbiter 110 observes the Xfer_end signal.

Figure 2:
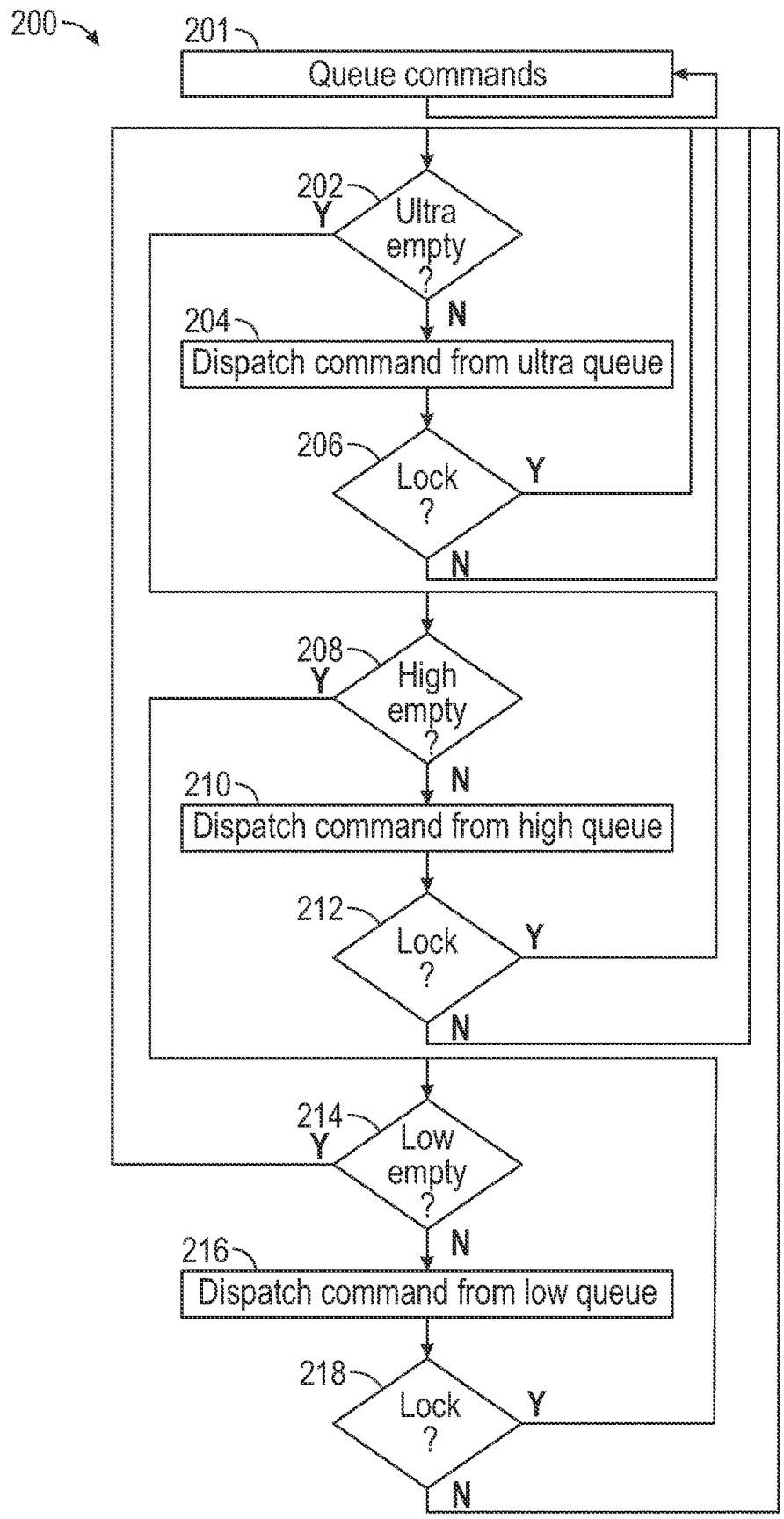
FIG. 2 a flowchart of a method for dispatching requests to a flash memory, according to certain examples of the present disclosure.

FIG. 2 a flowchart of a method for dispatching requests to a flash memory, according to certain examples of the present disclosure. Method 200 schedules flash memory commands. At block 201, commands are received from CPU 102 and queued in priority queues 106*a*-106*c*. Write requests are queued in low priority queue 106*a*. Read requests are queued in high priority queue 106*b*. Other requests are queued in ultra-high priority queue 106*c*. In some examples, additional queues may be used to further differentiate between command types. Block 201 may signal CPU 102 when any queue 106 is full to prevent a queue overflow.

At block 202, if ultra queue 106*c* is empty arbiter 110 will proceed to block 208. Otherwise, at block 204, arbiter 110 dispatches a command from ultra-high priority queue 106*c*, dispatches that command to flash target 104, and drives one or more of signals Xfer_begin, Xfer_end, Wr_xfer, Rd_xfer, and lock with values set by fields in the dispatched command. At block 206, if the lock bit is asserted, arbiter 110 will return to block 202 to dispatch another ultra high priority command and will otherwise proceed to block 208.

At block 208, if high priority queue 106*b* is empty, arbiter 110 will proceed to block 214. Otherwise, at block 210, arbiter 110 dispatches a command from high priority queue 106*b*, dispatches that command to flash target 104, and drives one or more of signals Xfer_begin, Xfer_end, Wr_xfer, Rd_xfer, and lock with values set by fields in the dispatched command. At block 212, if the lock signal is asserted, arbiter 110 will return to block 208 to dispatch another high priority command, otherwise it will return to block 202.

At block 214, if low priority queue 106*a* is empty, arbiter 110 will proceed to block 202. Otherwise, at block 216 arbiter 110 dispatches a command from low priority queue 106*a*, dispatches that command to flash target 104, and drives one or more of signals Xfer_begin, Xfer_end, Wr_xfer, Rd_xfer, and lock with values set by fields in the dispatched command. At block 218, if the lock signal is asserted, arbiter 110 will return to block 214 to dispatch another low priority command, otherwise it will return to block 202.

Figure 3:
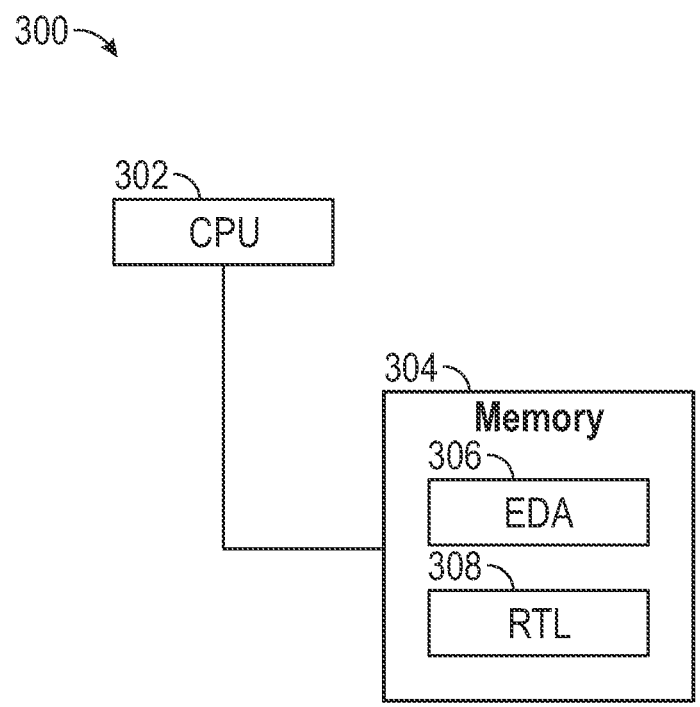
FIG. 3 is an illustration of a system for simulating a register transfer language description of a circuit, according to certain examples of the present disclosure.

FIG. 3 is an illustration of a system for simulating a register transfer language description of a circuit, according to certain examples of the present disclosure. System 300 includes CPU 302 and memory 304. Memory 304 includes electronic design automation (EDA) software 306 and a register transfer level (RTL) description 308. CPU 302 may be a conventional personal computer or workstation processor and memory 304 may be conventional memory. EDA may be conventional software for simulating, analyzing, and verifying a circuit design. EDA may include design capabilities and may prepare mask data files for manufacturing a circuit of a specified design. RTL 308 may be described in a one or more hardware description language files and may define the structure and operation of system 100.

Although example embodiments have been described above, other variations and embodiments may be made from this disclosure without departing from the spirit and scope of these embodiments.

What is claimed is:

1. An apparatus, comprising:
 a plurality of queues, wherein each queue comprises an input to receive a flash command, an output to send a flash command, and an empty signal output to signal when the queue is empty, wherein each queue is assigned a unique, ordered priority;
 a selector comprising a plurality of flash command inputs, a flash command output to a flash target, and a selection input, wherein each flash command input is coupled to a corresponding queue output;
 an arbiter comprising inputs receiving each queue empty signal and receiving a lock bit from the flash command output of the selector and comprising a selection output coupled to the selection input of the selector; and
 wherein the flash command comprises a lock bit and a plurality of control bits to output to control inputs on a flash target.

2. The apparatus of claim 1, wherein while the lock bit of the flash command output is asserted, the arbiter maintains the value of the selection output.

3. The apparatus of claim 1, wherein the arbiter comprises logic to identify a set of non-empty queues and set the selection output to the highest priority one of the non-empty queues.

4. The apparatus of claim 1, wherein the plurality of queues comprises a low priority queue, a high priority queue, and an ultra priority queue, and wherein:
 while the ultra priority queue is not empty the arbiter sets the value of the selection output to the ultra priority,
 while the ultra priority queue is empty and the high priority queue is not empty, the arbiter sets the value of the selection output to the high priority queue, and
 while the ultra priority queue is empty and the high priority queue is empty the arbiter sets the value of the selection output to the low priority queue.

5. The apparatus of claim 1, wherein the arbiter receives a transfer begin signal and a transfer end signal and wherein:
 the arbiter maintains a current value at the selection output while the lock bit is asserted,
 the arbiter sets the value of the selection output to the ultra priority queue while the ultra priority queue is not empty,
 the arbiter maintains the current value at the selection output between an assertion of the transfer begin signal and the assertion of the transfer end signal,
 the arbiter sets the value of the selection output to the high priority queue unless while the ultra priority queue is empty and the high priority queue is not empty, and
 the arbiter sets the value of the selection output to the low priority queue while the ultra priority queue is empty and the high priority queue is empty.

6. The apparatus of claim 1, wherein the arbiter receives a transfer begin signal, a transfer end signal, and a write transfer signal, and wherein:
 the arbiter maintains a current value at the selection output while the lock bit is asserted,
 the arbiter sets the value of the selection output to the ultra priority queue while the ultra priority queue is not empty, the arbiter maintains the current value at the selection output between an assertion of the transfer begin signal and the assertion of the transfer end signal while the write transfer signal is asserted, the arbiter sets the value of the selection output to the high priority queue while the ultra priority queue is empty and the high priority queue is not empty, and the arbiter sets the value of the selection output to the low priority queue while the ultra priority queue is empty and the high priority queue is empty.

7. The apparatus of claim 1 wherein the plurality of queues is stored in a single memory.

8. A method performed in a system comprising a plurality of queues wherein each queue is assigned a unique, ordered priority, the method comprising:

storing a new flash command having a lock flag and associated with a first priority in a one of the plurality of queues corresponding to the first priority, selecting a current queue from which to dispatch a flash command, and dispatching an oldest flash command from the current queue to a flash memory target.

9. The method of claim 8, wherein while the lock flag is asserted, maintaining the current queue selection.

10. The method of claim 8, wherein selecting the current queue comprises selecting the highest priority non-empty queue.

11. The method of claim 8, wherein selecting the current queue is performed by an arbiter to:

select the ultra priority queue unless it is empty, otherwise
select the high priority queue unless it is empty, otherwise
select the low priority queue.

12. The method of claim 8, wherein selecting the current queue is performed by an arbiter to:

maintain a current selection while the lock flag is asserted, otherwise
select the ultra priority queue unless the ultra priority queue is empty, otherwise
maintain the current selection between an assertion of a transfer begin signal and the assertion of a transfer end signal, otherwise
select the high priority queue unless the high priority queue is empty, otherwise
select the low priority queue.

13. The method of claim 8, wherein selecting the current queue is performed by an arbiter to:

maintain a current selection while the lock flag is asserted, otherwise
select the ultra priority queue unless the ultra priority queue is empty, otherwise
maintain the current selection between an assertion of the transfer begin signal and the assertion of the transfer end signal while the write transfer signal is asserted, otherwise
select the high priority queue unless the high priority queue is empty, otherwise
select the low priority queue.

14. The method of claim 8, wherein the plurality of queues are maintained as a data structure in a single memory.

15. A non-transitory, computer readable memory comprising register transfer language (RTL) structures and logic that when simulated forms a machine comprising:

a plurality of queues, wherein each queue comprises an input to receive a flash command, an output to send a flash command, and an empty signal output to signal while the queue is empty, wherein each queue is assigned a unique, ordered priority;

a selector comprising a plurality of flash command inputs, a flash command output to a flash target, and a selection input, wherein each flash command input is coupled to a corresponding queue output; and an arbiter comprising inputs receiving each queue empty signal and receiving a lock bit from the flash command output of the selector and comprising a selection output coupled to the selection input of the selector.

16. The medium of claim 15, wherein while the received lock bit is asserted, the arbiter maintains the value of the selection output.

17. The medium of claim 15, wherein the arbiter comprises logic to identify a set of non-empty queues and set the selection output to the highest priority non-empty queue.

18. The medium of claim 15, wherein the plurality of queues comprises a low priority queue, a high priority queue, and an ultra priority queue, and wherein:

the arbiter sets the value of the selection output to the ultra priority queue unless the ultra priority queue is empty, otherwise
the arbiter sets the value of the selection output to the high priority queue unless the high priority queue is empty, otherwise
the arbiter sets the value of the selection output to the low priority queue.

19. The medium of claim 15, wherein the arbiter receives a transfer begin signal and a transfer end signal and wherein:

the arbiter maintains a current selection output while the lock bit is asserted, otherwise
the arbiter sets the value of the selection output to the ultra priority queue unless the ultra priority queue is empty, otherwise
the arbiter maintains the current selection output between an assertion of the transfer begin signal and the assertion of the transfer end signal, otherwise
the arbiter sets the value of the selection output to the high priority queue unless the high priority queue is empty, otherwise
the arbiter sets the value of the selection output to the low priority queue.

20. The medium of claim 15, wherein the arbiter receives a transfer begin signal, a transfer end signal, and a write transfer signal, and wherein:

the arbiter maintains a current value at the selection output while the lock bit is asserted, otherwise
the arbiter sets the value of the selection output to the ultra priority queue unless the ultra priority queue is empty, otherwise
the arbiter maintains the current selection output between an assertion of the transfer begin signal and the assertion of the transfer end signal while the write transfer signal is asserted, otherwise
the arbiter sets the value of the selection output to the high priority queue unless the high priority queue is empty, otherwise
the arbiter sets the value of the selection output to the low priority queue.

* * * * *